United States Patent [19]

Ejima et al.

[11] Patent Number: 6,105,781
[45] Date of Patent: Aug. 22, 2000

[54] THIN-PLATE SUPPORTING CONTAINER WITH UNITARY POROUS GASKET

[75] Inventors: Kazutoshi Ejima, Saga-ken; Yukihiro Hyobu, Tokyo, both of Japan

[73] Assignees: Sumitomo Metal Industries, Ltd., Amagasaki; Kakizaki Manufacturing Co., Ltd., Tokyo, both of Japan

[21] Appl. No.: 09/107,829

[22] Filed: Jun. 30, 1998

Related U.S. Application Data

[62] Division of application No. 08/745,837, Nov. 8, 1996, Pat. No. 5,873,468.

[30] Foreign Application Priority Data

Nov. 16, 1995 [JP] Japan .................................. 7-298161
Sep. 26, 1996 [JP] Japan .................................. 8-254537

[51] Int. Cl.[7] .......................... B65D 85/30; B65D 43/06; B65D 53/00
[52] U.S. Cl. .......................... 206/710; 206/711; 220/378; 220/806
[58] Field of Search ................. 206/709–711, 454, 206/725; 141/98; 414/217, 292, 417, 950; 220/378, 803, 804, 806

[56] References Cited

U.S. PATENT DOCUMENTS

| | | | |
|---|---|---|---|
| 3,092,249 | 6/1963 | Chapman | 206/439 X |
| 3,425,193 | 2/1969 | Emmerson | 55/385.4 |
| 4,609,103 | 9/1986 | Bimer et al. . | |
| 4,666,479 | 5/1987 | Shoji | 55/385.4 |
| 4,738,905 | 4/1988 | Collins | 220/378 X |
| 4,830,182 | 5/1989 | Nakazato et al. | 206/459 |
| 4,896,590 | 1/1990 | Groos | 55/385.4 X |
| 5,353,949 | 10/1994 | Seibert et al. | 220/745 X |
| 5,469,963 | 11/1995 | Bonora et al. | 206/709 |
| 5,472,086 | 12/1995 | Holliday et al. | 206/711 |
| 5,476,176 | 12/1995 | Gregerson et al. | 206/711 |
| 5,482,161 | 1/1996 | Williams et al. | 206/711 |
| 5,573,567 | 11/1996 | Schauwecker et al. | 55/385.4 |
| 5,611,452 | 3/1997 | Bonora et al. | 206/710 X |
| 5,740,845 | 4/1998 | Bonora et al. | 206/710 X |

FOREIGN PATENT DOCUMENTS

| | | |
|---|---|---|
| 61-172085 U | 10/1986 | Japan . |
| 61-172086 U | 10/1986 | Japan . |
| 61-196536 U | 12/1986 | Japan . |
| 64-51058 U | 3/1989 | Japan . |
| Y-2-2-49721 | 12/1990 | Japan . |
| WO 94/25980 | 2/1994 | WIPO . |

*Primary Examiner*—Bryon P. Gehman
*Attorney, Agent, or Firm*—Oliff & Berridge, PLC

[57] ABSTRACT

A carrier box serving as a thin-plate supporting container includes a container body for defining therein a chamber for supporting and housing therein a plurality of semiconductor wafers and a lid for covering the container body. In one embodiment, the carrier box includes an internal-pressure adjusting mechanism for maintaining the internal pressure in the chamber at the same level as that of the external pressure against the chamber. The internal-pressure adjusting mechanism is composed of an opening formed in a wall of the container body and a filter detachably mounted in the opening for removing foreign matters while allowing gas to easily enter and exit the chamber so as to maintain the chamber in a clean state. In another embodiment, the carrier box includes a gasket made of a porous material. The gasket is provided between the container body and the lid for removing foreign matters while allowing gas to easily enter and exit the chamber so as to maintain the chamber in a clean state while maintaining the internal pressure in the chamber at the same level as that of the external pressure against the chamber.

15 Claims, 7 Drawing Sheets

THIN-PLATE SUPPORTING CONTAINER WITH UNITARY POROUS GASKET

This is a Division of application Ser. No. 08/745,837 filed Nov. 8, 1996, now U.S. Pat. No. 5,873,468.

BACKGROUND OF THE INVENTION

1. Field of the Invention

The present invention relates to a thin-plate supporting container for supporting and housing therein a plurality of thin plates such as semiconductor wafers. More specifically, the invention relates to a thin-plate supporting container which can adjust the internal pressure in accordance with the pressure and temperature changes in its surroundings when a plurality of thin plates such as semiconductor wafers are stored and conveyed in the container.

2. Description of the Prior Art

Various types of measures have been taken against problems caused in a case where a thin-plate supporting container is conveyed or transported when the surrounding pressure and temperature change. For example, in the case of transportation by aircraft, the air pressure in a cargo compartment is greatly decreased in a high flight. For that reason, when the thin-plate supporting container is maintained in an airtight state, the internal pressure is remarkably higher than the outside air pressure. As a result, there is a problem in that the container expands or the air in the container leaks out, so that it is not possible to open the lid thereof after the aircraft is landed. In addition, when the surrounding temperature is increased during transportation, there is the same problem.

As one of measure directed such problems, a semiconductor-wafer supporting container is proposed in Japanese Utility Model Publication No. 2-49721.

As shown in FIGS. 11 and 12, this semiconductor-wafer supporting container 1 generally comprises a container body 3 for supporting and housing therein a plurality of semiconductor wafers 2, a lid 4 for covering the upper side of the container body 3 to maintain the interior of the container body at an airtight state, and a molecule filter 5 integral with a side wall 3A of the container body 3 for allowing air to enter and exit the container body 3.

By providing this molecule filter 5, air can enter and exit the semiconductor-wafer supporting container 1 through the filter 5. As a result, even if the pressure change is caused between the inside and outside of the container 1 due to the change in the outside air pressure and so forth, it is possible to maintain the internal pressure at the same value as that of the outside air pressure, so that it is possible to prevent the problems such as the expansion of the semiconductor-wafer supporting container 1.

However, in the case of the molecule filter 5, since the air passing rate is extremely slow, it is not possible to respond to the rate of the pressure change caused in the cargo compartment of aircraft and so forth. In order to allow a quick response, the area of the molecule filter 5 must be increased. However, when the molecule filter 5 is mounted on the container body 3, the area thereof is restricted. Therefore, the semiconductor-wafer supporting container 1 having the molecule filter 5 has not been put to practical use.

In addition, the whole semiconductor-wafer supporting container 1 must be washed before the semiconductor wafers 2 are housed therein. In this case, if the semiconductor-wafer supporting container 1, on which the molecule filter 5 is mounted, is washed, foreign matters such as dust are adhered to the molecule filter 5. If the semiconductor-wafer supporting container having the molecule filter 5, to which the dust or the like is attached, is used, the impurities adhered to the molecule filter 5 are scattered in the container 1. Therefore, such a container can not suitably be used. For that reason, the semiconductor-wafer supporting container 1 must be washed before the molecule filter 5 is mounted thereon.

In addition, since a great amount of dust or the like is adhered to the semiconductor-wafer supporting container 1 after it is used for the transportation of the semiconductor wafers 2, the container 1 must be washed when it is reused. However, if the molecule filter 5 is washed, it can not be used as mentioned above. On the other hand, since the molecule filter 5 is integral with the container body 3, it can not be removed from the container body 3. As a result, the semiconductor-wafer supporting container 1 can not be reused.

Moreover, in a case where the spent semiconductor-wafer supporting container 1 is discarded or recycled, it is required to divide the container 1 into members of different materials. In this case, even if the container body 3 and the lid 4 are made of different materials, they can be easily separated from another to carry out the subsequent processing. However, since the molecule filter 5 is integrally mounted on the container body 3, they can not easily be separated from another. For that reason, there is a problem in that it is difficult to carry out the subsequent disposal and recycling.

SUMMARY OF THE INVENTION

It is therefore an object of the present invention to eliminate the aforementioned problems and to provide a thin-plate supporting container which can quickly respond to the change in the outside air pressure so as to optimally adjust the internal pressure and which can be easily reused or recycled.

In order to accomplish the aforementioned and other objects, according to a first aspect of the present invention, there is provided a thin-plate supporting container which comprises: a container body for defining therein a chamber for supporting and housing therein a plurality of thin plates; a lid for covering the container body; and internal-pressure adjusting means for maintaining the internal pressure in the chamber at the same level as that of the external pressure against the chamber while maintaining the chamber in a clean state, the internal-pressure adjusting means including: an opening for establishing a communication between the inside and outside of the chamber; and filter means, detachably mounted in the opening, for removing foreign matters such as dust while allowing gas to easily enter and exit the chamber. The opening may be formed in a wall of the container body or the lid. Alternatively, the internal-pressure adjusting means may be provided between the container body and the lid.

According to the first aspect, since the opening formed in the wall of the container body or the like establishes the communication between the inside and outside of the chamber, gas can enter and exit the chamber through the opening, so that the internal pressure is adjusted so as to be equal to the outside air pressure. Since the filter is fitted into the opening, foreign matters such as dust in the gas entering and exiting the chamber can be removed by the filter, so that the foreign matters are prevented from entering the chamber. Since the filter is designed to remove foreign matters such as dust while allowing gas to easily enter and exit the chamber, it can quickly respond to the change in the outside air pressure so as to optimally adjust the chamber's internal pressure. In a case where the container is washed for reuse, the filter detachably mounted in the opening is removed from the opening, and after only the container is washed, the filter is mounted in the opening again. In the case of recycling, the filter is removed from the opening, and it is divided into parts of different materials.

According to a second aspect of the present invention, there is provided a thin-plate supporting container according to the first aspect, wherein the filter means comprises: a cylindrical body fitted into the opening; a flange portion extending radially from the circumference of one end of the cylindrical body for tightly contacting a surface of the edge portion of the opening when the cylindrical body is fitted into the opening; engaging means provided on the other end of the cylindrical body, the engaging means being associated with the flange portion for clamping the edge portion of the opening when the cylindrical body is fitted into the opening, so as to secure the cylindrical body to the opening; and a filter material, mounted in the cylindrical body, for removing foreign matters while allowing gas to easily enter and exit the chamber. The engaging means may comprise a pair of engaging claws which extend radially from the other end of the cylindrical body. Alternatively, the engaging means may comprise a leg portion extending axially from the other end of the cylindrical body, and a claw portion extending outwardly from an end of the leg portion.

According to the second aspect, in a case where the filter is mounted in the opening, the cylindrical body of the filter is fitted into the opening. At this time, the edge portion of the opening is clamped by the flange portion and the engaging means such as a pair of engaging claws, so that the filter is secured to the edge portion of the opening.

According to a third aspect of the present invention, there is provided a thin-plate supporting container which comprises: a container body for defining therein a chamber for supporting and housing therein a plurality of thin plates; a lid for covering the container body; and a gasket, provided between the container body and the lid, for removing foreign matters while allowing gas to easily enter and exit the chamber so as to maintain the chamber in a clean state while maintaining the internal pressure in the chamber at the same level as that of the external pressure against the chamber. The gasket may be formed of a porous material which has a plurality of fine pores, each having a diameter smaller than 1.0 $\mu$m, preferably a diameter in the range of from 0.5 to 1.0 $\mu$m. The porous material may be formed by foaming a fluorocarbon resin or an olefin resin. Alternatively, the gasket may be formed of a woven fabric or a non woven fabric.

According to the third aspect, since the gasket allows gas to enter and exit the chamber, gas can enter and exit the chamber through the gasket when the container body is covered by the lid. Since the gasket extends circumferentially about the container, the area of the gasket for allowing gas to enter and exit the chamber is sufficiently wide. Therefore, it is possible to quickly respond to the change in the outside air pressure about the container, so as to maintain the internal pressure at the same level as that of the outside air pressure. In this case, dust or the like does not enter the chamber since the gasket restricts the passage of dust or the like. Thus, it is possible to prevent dust or the like from entering the chamber to optimally adjust the internal pressure while maintaining the chamber in a clean state.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to this specific embodiment, but are for explanation and understanding only.

In the drawings.

DESCRIPTION OF THE PREFERRED EMBODIMENTS

Referring now to the accompanying drawings, particularly to FIGS. 1 through 10, the preferred embodiments of the present invention will be described below.

According to the present invention, a thin-plate supporting container is a container for supporting and housing therein a plurality of thin plates in parallel. These thin plates include semiconductor wafers, storage discs, liquid crystal plates and so forth, and are required to prevent dust or the like from being adhered to the surfaces thereof. The interior of the thin-plate supporting container according to the present invention is formed as a sealed structure since it is used for housing therein the aforementioned thin plates. Herein, there is described an example of the use of a carrier box for housing therein a wafer carrier which supports thereon a plurality of semiconductor wafers serving as thin plates.

Figure 1:
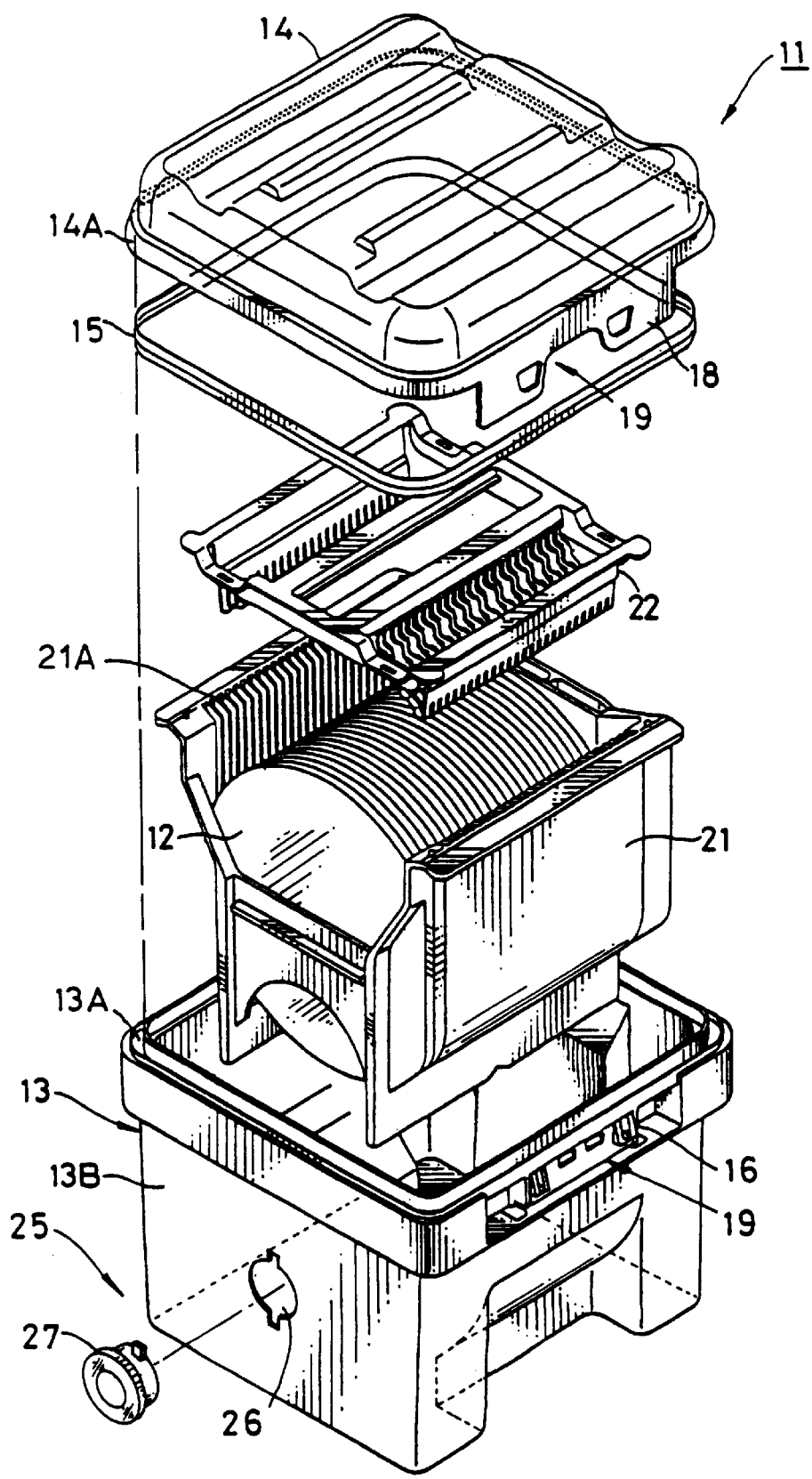
FIG. 1 is an exploded perspective view illustrating the whole construction of the first preferred embodiment of a carrier box according to the present invention.

Referring to FIGS. 1 through 4, the first preferred embodiment of a carrier box according to the present invention will be described. As shown in FIG. 1, a carrier box 11 generally comprises a container body 13 for housing therein a wafer carrier 21 which houses therein and supports thereon a plurality of semiconductor wafers and which will be described later, a lid 14 for covering the upper side of the container body 13 when the wafer carrier 21 is housed in the container body 13, and a gasket 15 provided between the container body 13 and the lid 14 for maintaining the interior of the carrier box 11 in an airtight and clean state.

The container body 13 is substantially rectangular in whole. The upper end portion of the circumference of the container body 13 is formed with an annular groove 13A for engaging a gasket 15 to maintain the interior of the carrier box 11 in an airtight state. Engaging claws 16 are provided on the upper portions of the opposite two of the four side walls of the container body 13. As will be described later, these engaging claws 16 are associated with engaging pieces 18 of the lid 14 for forming fixing means 19 for fixing the lid 14 to the container body 13.

The lid 14 is so formed as to be a shallow dish. The lower end portion of the circumference of the lid 14 is formed with an annular groove 14A which engages the gasket 15 for maintaining the interior of the carrier box 11 in an airtight state. The lid 14 is also provided with the engaging pieces 18, which are associated with the engaging claws 16 for forming the fixing means 19, at locations facing the engaging claws 16 of the container body 13.

The plurality of semiconductor wafers 12 are supported on the wafer carrier 21 at regular intervals by means of supporting ribs 21A. The wafer carrier 21 supporting thereon the plurality of semiconductor wafers 12 is housed in the container body 13. Then, a thin-plate presser member 22 is mounted on the upper side of the wafer carrier 21, and the container body 13 is covered by the lid 14. When the engaging pieces 18 of the lid 14 are engaged with the engaging claws 16 of the container body 13, the lid 14 is fixed to the container body 13. Thus, the wafer carrier 21 and the thin-plate presser member 22 are supported on the container body 13 and the lid 14, and the respective semiconductor wafers 12 are supported on the wafer carrier 21 and the thin-plate presser member 22. Therefore, even if impact is applied to the carrier box 11 from the outside, the respective semiconductor wafers 12 do not vibrate, so that it is possible to carry out the stable transport of the semiconductor wafers 12.

A side wall 13B of the container body 13 is provided with an internal-pressure adjusting mechanism 25. The internal-pressure adjusting mechanism 25 comprises an opening 26 formed in the side wall 13B of the container body 13, and a filter 27 detachably mounted in the opening 26.

Figure 4:
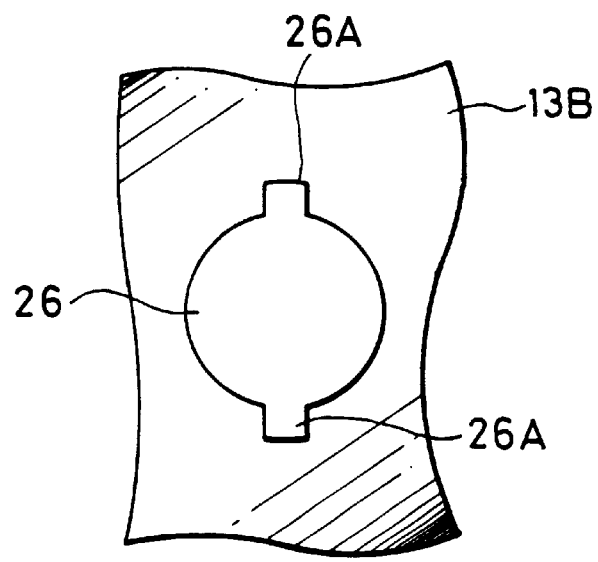
FIG. 4 is a front view illustrating the opening formed in the side wall of the container body shown in FIG. 1.

As can be clearly seen from FIG. 4, the opening 26 is a substantially circular opening formed in the side wall 13B of the container body 13, and establishes the communication between the inside and outside of the container body 13. Thus, gases are permitted to enter and exit the container body 13, so that the inside air pressure is adjusted so as to be equal to the outside air pressure. The opening 26 is provided with a pair of cutouts 26A in the upper and lower portions thereof. The cutouts 26A are designed to receive engaging claws 30 of the filter 27 which will be described later. Furthermore, the gasses entering and exiting the container body 13 through the opening 26 include air surrounding the carrier box 11, and gas introduced into the interior of the carrier box 11. As the gas introduced into the carrier box 11, there are nitrogen gas and the like.

Figure 2:
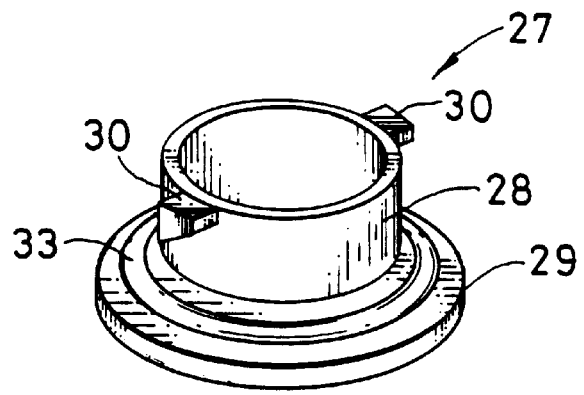
FIG. 2 is a perspective view of the filter of the carrier box shown in FIG. 1.
Figure 3:
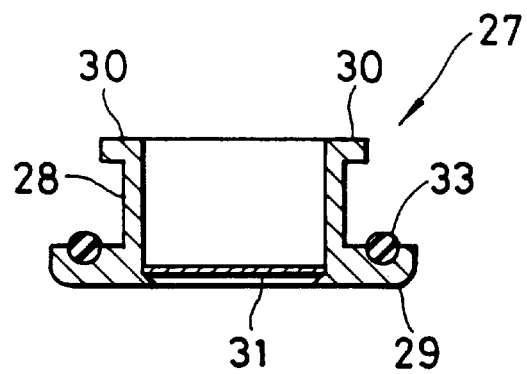
FIG. 3 is a side sectional view of the filter shown in FIG. 2.

The filter 27 has the capacity to remove dust or the like contained in the outside gas while allowing gas to enter and exit the container body 13 through the opening 26, and it is designed to allow gas to smoothly pass therethrough. That is, the filter 27 is designed to have the capacity to allow gas to easily pass therethrough without increasing the flow resistance to a great value when the gas enters and exits the container body 13 through the opening 26. Specifically, as shown in FIGS. 2 and 3, the filter 27 comprises a cylindrical body 28, a flange portion 29, a pair of engaging claws 30, and a filter material 31.

The cylindrical body 28 has substantially the same outer diameter as the inner diameter of the opening 26 to be fitted into the opening 26.

The flange portion 29 is provided on the circumference of one side of the cylindrical body 28 (the lower portion in FIGS. 2 and 3) so as to extend circumferentially about the cylindrical body 28. The flange portion 29 is designed to contact one surface of the edge portion of the opening 26 when the cylindrical body 28 is fitted into the opening 26. The flange portion 29 is provided with an annular gasket 33 on the inner surface thereof. When the cylindrical body 28 is fitted into the opening 26 to allow the flange portion 29 to contact one surface of the edge portion of the opening 26, the gasket 33 is brought into pressing contact with the flange portion 29 and the edge portion of the opening 26 to tightly seal a space portion therebetween.

The pair of engaging claws 30 are provided on the other side of the cylindrical body 28 so as to extend radially from the cylindrical body 28 in the opposite directions. The engaging claws 30 are designed to be received in the cutouts 26A of the opening 26. Also, the engaging claws 30 are oriented in the opposite directions to each other. Each of the engaging claws 30 has a wedge-shaped cross-section. That is, one surface of the engaging claw 30 facing the flange portion 29 is inclined. This inclination serves to secure the filter 27 to the side wall 13B of the container body 13. That is, after the respective engaging claws 30 are received in the corresponding cutouts 26A to cause the cylindrical body 28 to engage the opening 26, when the cylindrical body 28 is rotated, the inclined surfaces of the engaging claws 30 are designed to be brought into pressing contact with the other surface of the edge portion of the opening 26. Thus, the edge portion of the opening 26 is clamped by the flange portion 29 and the engaging claws 30, so that the filter 27 is secured to the side wall 13B of the container body 13.

The filter material 31 is arranged in the cylindrical body 28 so as to remove dust or the like from the gas passing through the interior of the cylindrical body 28. That is, when the gas surrounding the carrier box 11 enters the carrier box 11 through the opening 26, the filter material 31 is designed to remove dust or the like from the gas and to allow only the gas to pass therethrough. As mentioned above, the filter material 31 is designed to have the capacity to remove the dust or the like while allowing the gas to smoothly pass therethrough. That is, the filter material 31 is designed to have the capacity to allow the gas to easily pass therethrough without increasing the flow resistance to a great value when the gas enters and exits the container body 13 through the opening 26. In addition, the filter material 31 is designed to quickly respond to an abrupt pressure change about the carrier box 11 since gas can easily pass through the filter material 31.

With this construction, the carrier box 11 is used for the transportation of the semiconductor wafers 12 as follows.

First, the container body 13 and the lid 14 are molded or formed, and then, washed to remove foreign matters adhered to the surfaces thereof. After washing the container body 13, the filter 27 is mounted on the container body 13 as follows. That is, after the respective engaging claws 30 of the cylindrical body 28 of the filter 27 are aligned with the corresponding cutouts 26A of the opening 26, the cylindrical body 28 is inserted into the opening 26. After the flange portion 29 is brought into contact with the side wall 13B of the container body 13, the whole filter 27 is rotated.

Thus, the edge portion of the opening 26 is clamped by the flange portion 29 and the engaging claws 30, so that the filter 27 is fixed to the side wall 13B of the container body 13 while it is fitted into the opening 26.

Then, the plurality of semiconductor wafers 12 are inserted into the wafer carrier 21, and then, the wafer carrier 21 is inserted into the container body 13 of the carrier box 11. Thereafter, the thin-plate presser plate 22 is mounted on the wafer carrier 21 so as to press the semiconductor wafers 12 from the upper side, and then, the lid 14 is arranged thereon so as to cover the container body 13. Then, the lid 14 is pressed from the upper side to cause the engaging pieces 18 of the lid 14 to engage the engaging claws 16 of the container body 13. Thus, the container body 13 and the lid 14 are fixed to each other while supporting the semiconductor wafers 12 therein.

In this condition, the carrier box 11 is transported by an aircraft or the like. In this case, as the air pressure around the carrier box 11 is decreased, the internal pressure of the carrier box 11 is relatively increased. As a result, gas exits the carrier box 11 through the filter 27 of the internal-pressure adjusting mechanism 25, so that the internal pressure of the carrier box 11 is maintained substantially at the same value as that of the outside air pressure.

Then, when the aircraft is landed, the internal pressure of the carrier box 11 is relatively decreased, so that the outside air enters the carrier box 11 through the filter 27. At this time, dust or the like in the gas are removed by the filter 27. Thus, the internal pressure of the carrier box 11 is maintained substantially at the same value as that of the outside air pressure.

Then, the carrier box 11, which has been used for transporting the semiconductor wafers 12, is washed for the reuse thereof. In this case, the filter 27 is first removed from the container body 13. Specifically, the filter 27 is rotated in the opposite direction to that when it is attached to the container body 13, so as to cause the engaging claws 30 to be aligned with the cutouts 26A of the opening 26, and then, the filter 27 is drawn out of the opening 26. The removed filter 27 is stored in a place wherein there is no dust or the like. Then, the container body 13, the lid 14 and so forth are washed. After washing, the filter 27 is mounted again in the same manner as that mentioned above, and the carrier box 11 is used for the transportation of the semiconductor wafers 12 again.

The spent carrier box 11 is recycled or discarded. In this case, the respective parts are separated in accordance with the materials thereof.

In particular, although the parts must be strictly separated when the spent carrier box 11 is recycled, the filter 27 made of a different material from the container body 13 can be easily removed from the container body 13 in the aforementioned manner. After the parts are separated in accordance with the materials thereof, the subsequent processing is carried out.

As mentioned above, since it is designed so that the resistance is not so great when gas enters and exits the carrier box 11 through the filter material 31 of the filter 27, it is possible to quickly respond to the abrupt pressure change outside the carrier box 11. As a result, the internal pressure in the carrier box 11 can respond to the change in the outside air pressure, so that it is possible to optimally adjust the internal pressure.

In addition, since the filter 27 can be easily removed from the container body 13, it is possible to easily carry out the processing such as reuse and recycling.

Figure 5:
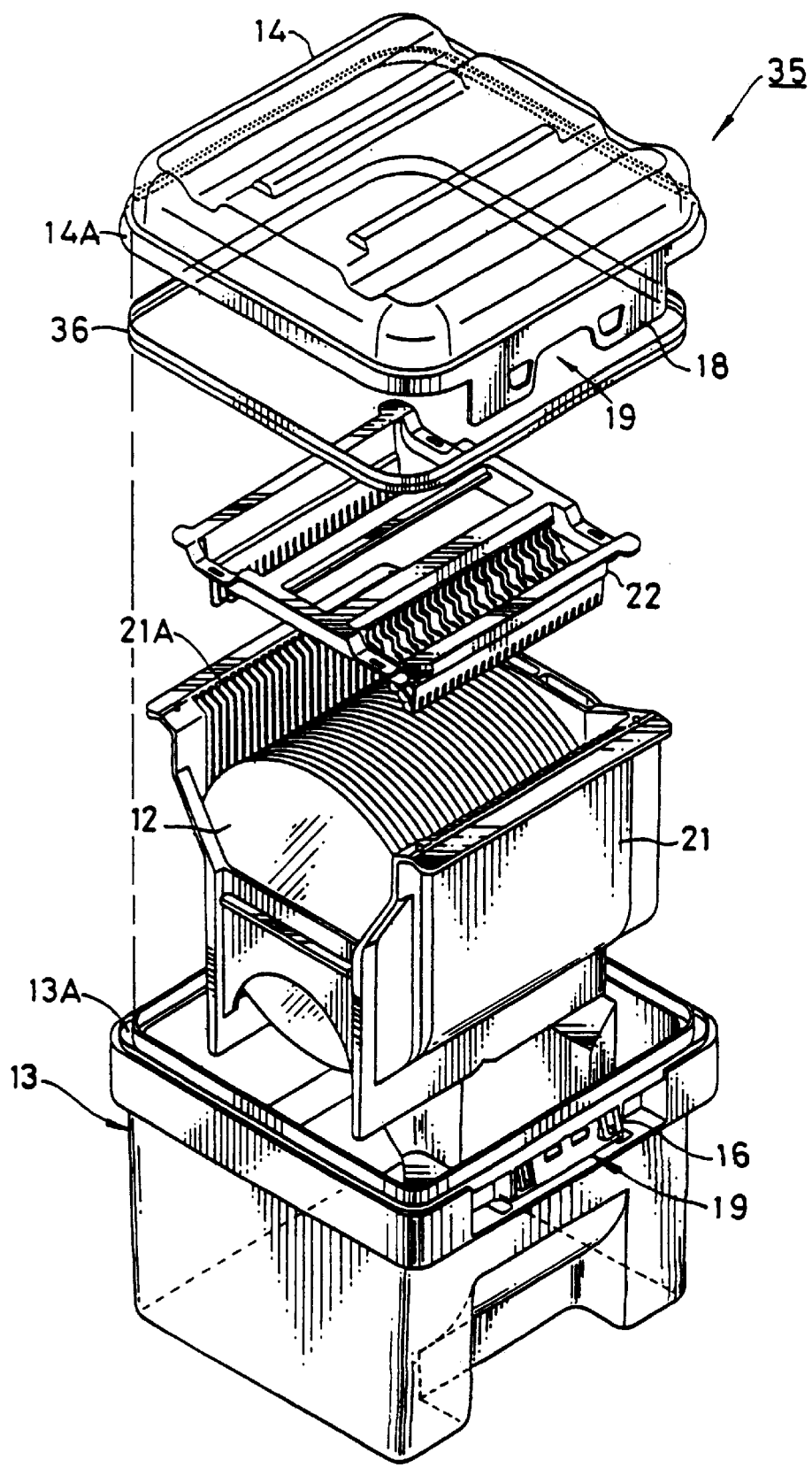
FIG. 5 is an exploded perspective view illustrating the whole construction of the second preferred embodiment of a carrier box according to the present invention.

Referring to FIG. 5, the second preferred embodiment of a thin-plate supporting container of the present invention will be described below. In this preferred embodiment similar to the first preferred embodiment, a carrier box is used as the thin-plate supporting container. In this preferred embodiment, the whole construction of the carrier box is substantially the same as the carrier box in the first preferred embodiment. Therefore, the same reference numbers are assigned to the same portions, and the descriptions thereof are omitted.

As shown in FIG. 5, in this preferred embodiment, a carrier box 35 generally comprises a container body 13, a lid 14, and a gasket 36 provided between the container body 13 and the lid 14 for maintaining the interior of the carrier box 11 in a clean state.

The construction of the container body 13 is the same as that in the first preferred embodiment, except that the internal-pressure adjusting mechanism 25 is not provided. The construction of the lid 14 is the same as that in the first preferred embodiment. The annular grooves 13A and 14A are formed shallowly. The gasket 36 is designed to engage the annular grooves 13A and 14A so as to contact the outside air in a wide area between the annular grooves 13A and 14A.

The gasket 36 has the functions of allowing gas to enter and exit the container body 13 covered by the lid 14 so as to maintain the internal pressure at the same level as that of the outside air pressure, and of restricting the passage of dust or the like. That is, the gasket 36 does not tightly seal the container body 13, and it has the function of allowing the passage of gas such as air so as to maintain the internal pressure at the same level as that of the outside air pressure. In addition, the gasket 36 is designed to restrict the passage of dust or the like to prevent impurities from being adhered to the surfaces of the semiconductor wafers 12 housed in the container body 13.

The gasket 36 is formed of a porous material. That is, the gasket 36 is formed of a material having a plurality of continuous fine pores for establishing the communication between the inside and outside of the gasket 36. Such fine pores have a smaller diameter than that of dust or the like, and are preferably set to have a diameter in the range of from about 0.5 to 1.0 $\mu$m. However, in a case where dust or the like having a smaller diameter of 0.5 $\mu$m is suspended around the carrier box 35, the pores may be formed so as to have a smaller diameter than that of such dust or the like.

The material of the gasket 36 may be a fluorocarbon resin or an olefin resin. Using any one of these resins as the material, the porous gasket 36 is formed by foaming. Alternatively, the gasket 36 may be formed of a woven fabric or a non woven fabric using extremely thin fibers.

With this construction, the carrier box 35 is used for the transportation of the semiconductor wafers 12 as follows.

First, similar to the first preferred embodiment, the container body 13 and the lid 14 are molded or formed, and then, washed to remove foreign matters adhered to the surfaces thereof. After washing the container body 13 and so forth, the gasket 36 is mounted on the container body 13.

Then, the wafer carrier 21 supporting thereon the plurality of semiconductor wafers 12 is inserted into the container body 13 of the carrier box 35. Thereafter, the thin-plate presser plate 22 is mounted on the wafer carrier 21, and then, the lid 14 is arranged thereon so as to cover the container body 13. At this time, the gasket 36 is fitted into the respective annular grooves 13A and 14A so as to contact the outside air in a sufficiently wide area between the container body 13 and the lid 14.

Then, the lid 14 is pressed from the upper side to cause the engaging pieces 18 of the lid 14 to engage the engaging claws 16 of the container body 13. Thus, the container body 13 and the lid 14 are fixed to each other while supporting the semiconductor wafers 12 therein.

In this condition, similar to the first preferred embodiment, the carrier box 35 is transported. In this case, as the air pressure outside the carrier box 11 is decreased, gas exits the carrier box 35 through the whole area of the gasket 36, so that the internal pressure of the carrier box 35 is maintained substantially at the same value as that of the outside air pressure. On the other hand, when the internal pressure of the carrier box 35 is decreased, the outside air enters the carrier box 35 through the gasket 36. At this time, the dust or the like in the gas are removed by the gasket 36. Thus, the internal pressure of the carrier box 35 is maintained substantially at the same value as that of the outside air pressure while maintaining the interior of the carrier box 35 in the clean state.

Furthermore, if the temperature outside the carrier box 35 is greatly varied during transportation, the internal pressure is maintained substantially at the same value as that of the outside air pressure in the same manner.

Then, the carrier box 35, which has been used for the transportation of the semiconductor wafers 12, is washed for the reuse thereof. In this case, the gasket 36 is removed from the container body 13. If it is possible to reuse the removed gasket 36, it is stored in a place wherein there is no dust or the like. In a case where a great amount of dust or the like is adhered to the gasket 36, a new gasket is used. The container body 13, the lid 14 and so forth are washed. After washing, the gasket 36 is mounted again, and the carrier box 35 is used for the transportation of the semiconductor wafers 12 again.

In a case where the spent carrier box 35 is recycled, the gasket 36 made of a different material from the container body 13 is separated from the container body 13. Since the gasket 36 is a separate member from the container body 13, it can be easily removed from the container body 13. Then, after the parts are separated in accordance with the materials thereof, the subsequent processing is carried out.

As mentioned above, the gasket 36 is formed of a porous material, and gas is permitted to enter and exit the carrier box 35 through the whole gasket 36 so as to maintain the internal pressure at the same value as that of the outside air pressure. Therefore, it is possible to quickly respond to an abrupt pressure change outside the carrier box 11. As a result, similar to the first preferred embodiment, the internal pressure in the carrier box 35 can follow the change of the outside air pressure, so that it is possible to optimally adjust the internal pressure while maintaining the interior of the carrier box 35 in the clean state.

In addition, gasket 36 is a separate member from the container body 13, and it can be easily removed from the container body 13. Therefore, it is possible to easily carry out the processing such as reuse and recycling.

While the carrier boxes 11 and 35 for supporting the semiconductor wafers 12 therein have been used as a thin-plate supporting container in the preferred embodiments of the present invention, thin-plate supporting containers for supporting other thin plates may be used so as to have the same function and advantageous effects as those of the aforementioned preferred embodiments.

Figure 6:
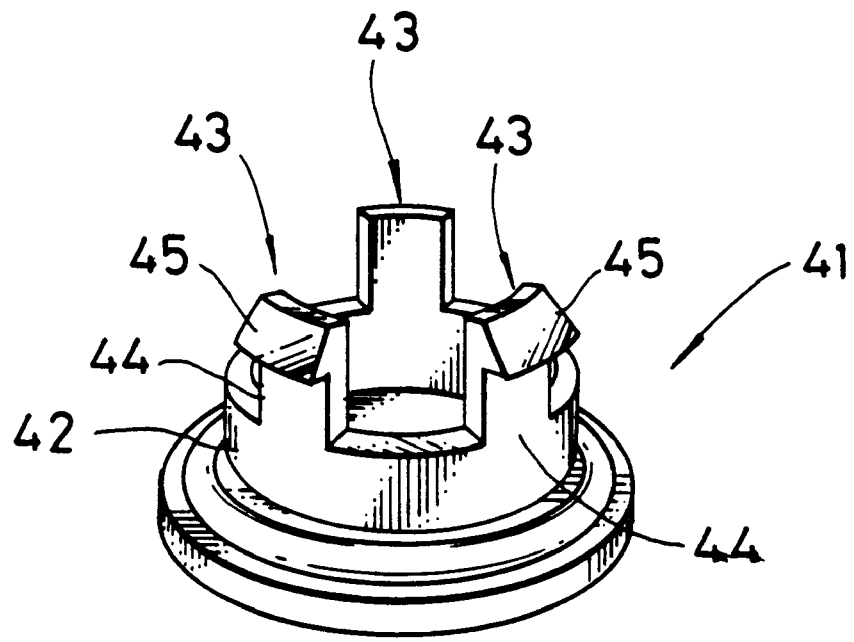
FIG. 6 is a perspective view of a first modification of the filter of the first preferred embodiment of the carrier box shown in FIG. 1.
Figure 7:
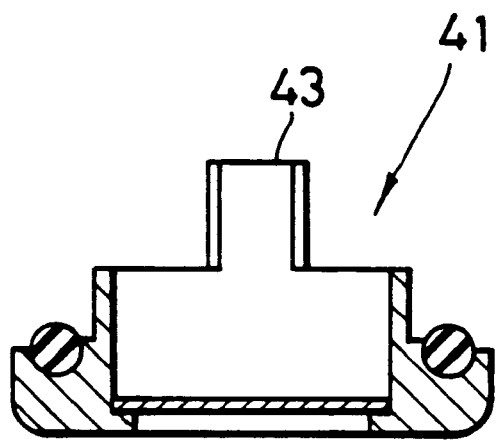
FIG. 7 is a side sectional view of the filter shown in FIG. 6.
Figure 8:
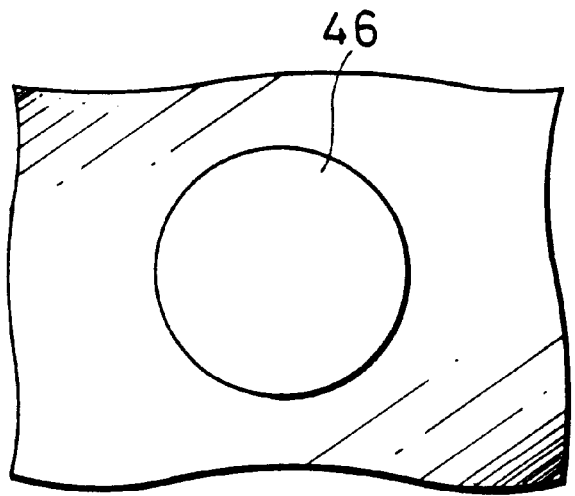
FIG. 8 is a front view illustrating an opening formed in a side wall of the container body for engaging the filter shown in FIG. 6.

While two engaging claws 30 for securing the filter 27 to the opening 26 have been provided so as to extend radially outwardly from the cylindrical body 28 in the first preferred embodiment, three engaging claws may be provided as shown in FIGS. 6 through 8. In the modification shown in these figures, the tip portion (the upper end portion in FIG. 6) of a cylindrical body 42 of a filter 41 is provided with three engaging claws 43. Each of these engaging claws 43 comprises a leg portion 44 extending axially from the cylindrical body 42, and a claw portion 45 projecting outwardly from the upper end portion of the leg portion 44. The leg portion 44 is resilient so as to be able to bend inwardly. Other constructions are the same as those in the aforementioned preferred embodiments. As shown in FIG. 8, a circular opening 46 is formed in a side wall of the container body. With this construction, in a case where the filter 41 is mounted on the container body, the filter 41 is inserted into the opening 46. At this time, the three engaging claws 43 are bent inwardly to engage the opening 46. In a case where the filter 41 is removed from the container body, the three engaging claws 43 are bent inwardly, and then, the filter 41 is pushed out of the opening 46. Thus, the filter 41 can be easily removed from the opening 46. In this way, this preferred embodiment has the same function and advantageous effects as those in the first preferred embodiment. Furthermore, the cylindrical body 42 may have another shape such as a quadrangular cylindrical shape. In the case of a quadrangular cylindrical body, the opening 46 is also quadrangular.

Figure 9:
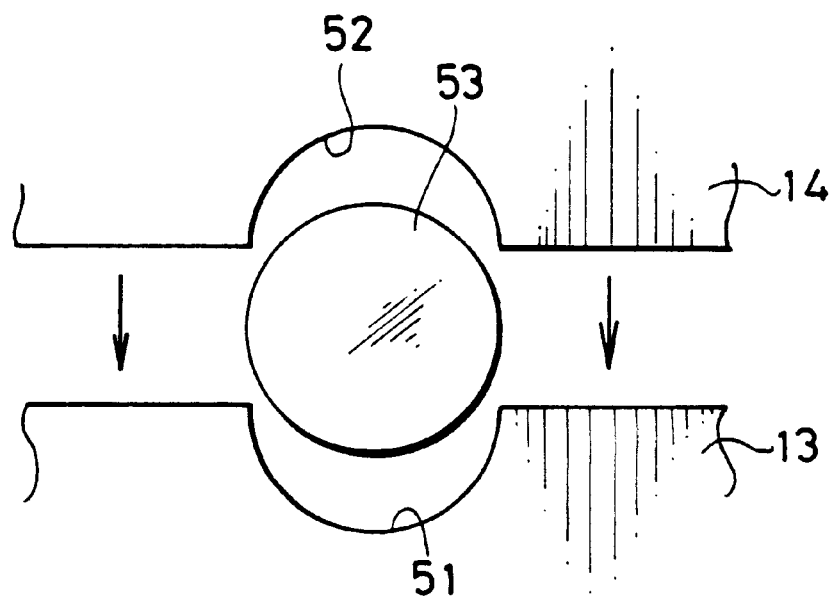
FIG. 9 is a schematic front view illustrating a second modification of the opening of the first preferred embodiment of the carrier box shown in FIG. 1.

While the opening 26 of the internal-pressure adjusting mechanism 25 has been formed on the side wall 13B of the container body 13 in the first preferred embodiment, the opening 26 may be formed in any portions of the container body 13 and the lid 14. Alternatively, as shown in FIG. 9, the container body 13 and the lid 14 may have semicircular cutouts 51 and 52, respectively, and the same filter 53 as that in any one of the aforementioned preferred embodiments may be arranged between the cutouts 51 and 52. This modification can have the same function and advantageous effects as those in the aforementioned preferred embodiments.

Figure 10:
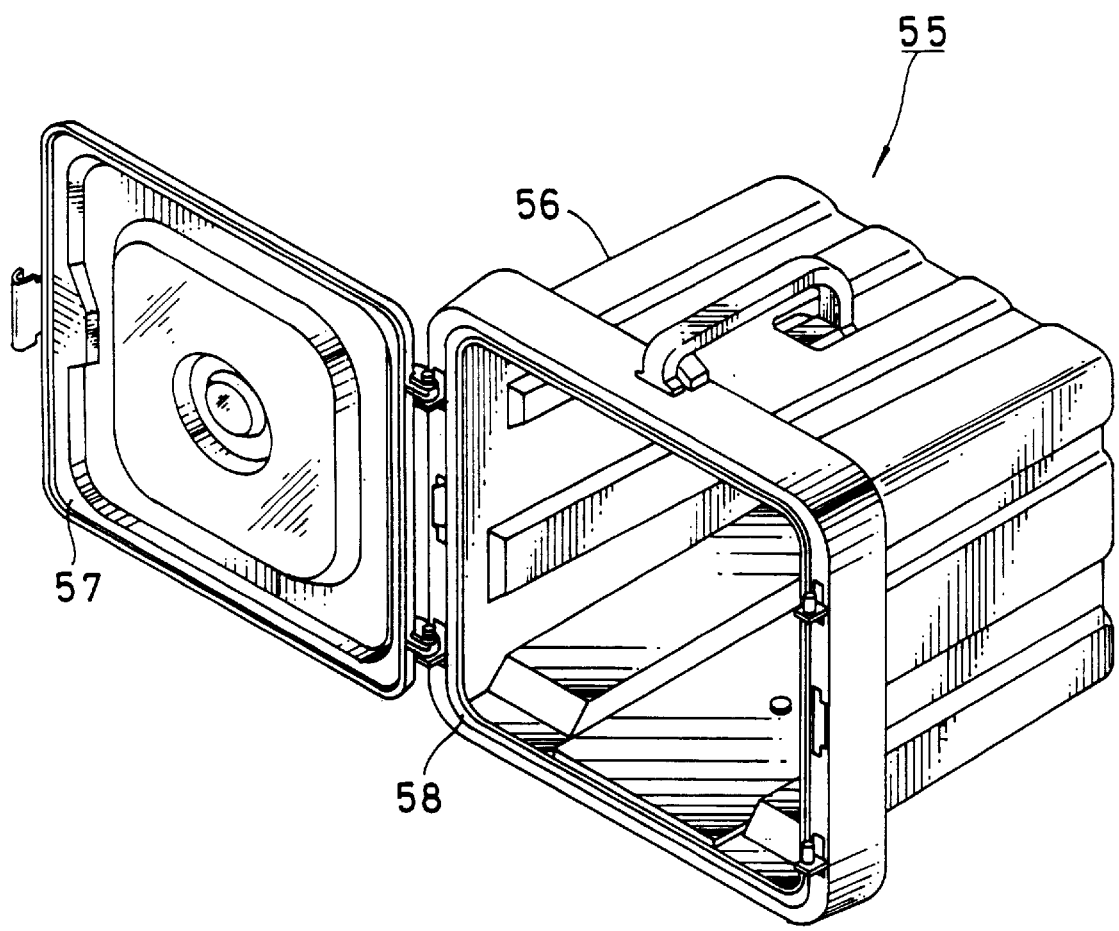
FIG. 10 is a perspective view of a modification of the second preferred embodiment of the carrier box shown in FIG. 5.
Figure 11:
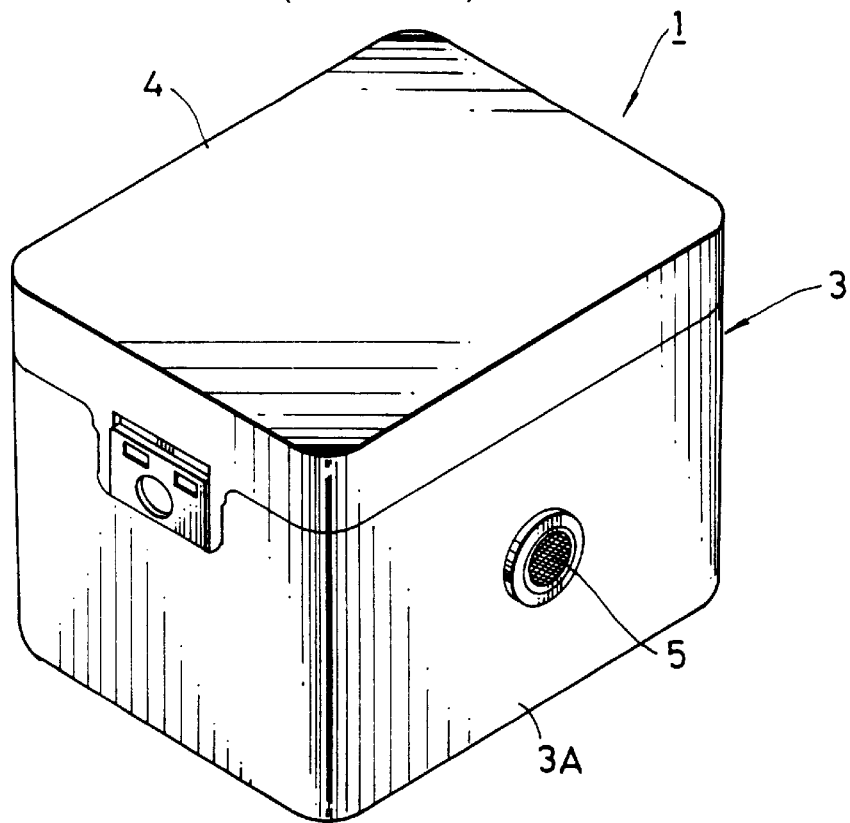
FIG. 11 is a perspective view of a conventional thin-plate supporting container.
Figure 12:
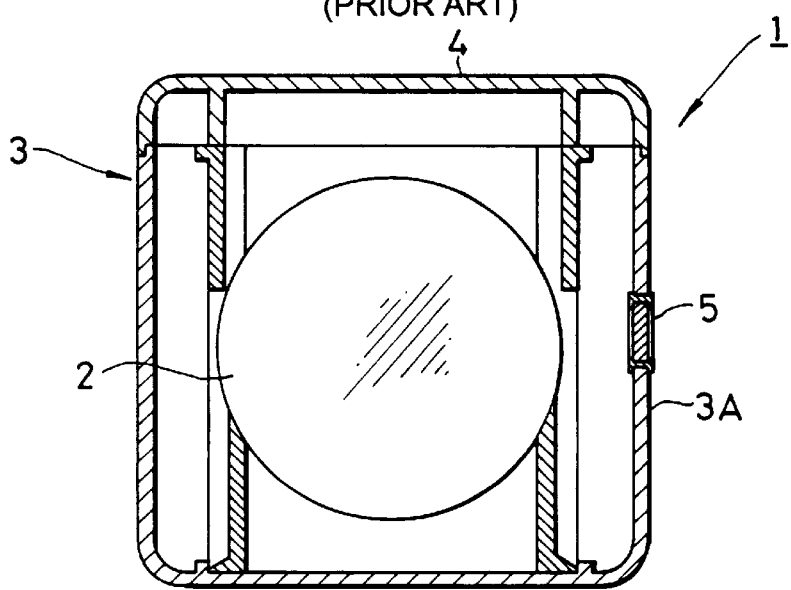
FIG. 12 is a front sectional view of the thin-plate supporting container shown in FIG. 11.

While the container body 13 of the carrier box 35 has been open on the upper side in the second preferred embodiment, a carrier box 55, which is open on the front side, may be used as shown in FIG. 10. In this case, a container body 56 is open on the front side, and a lid 57 is pivotably mounted on the side portion of the opening of the container body 56. A gasket 58 is mounted at a location surrounding the open end of the container body 56. Thus, it is possible to have the same function and advantageous effects as those in the second preferred embodiment.

While the wafer carrier 21 has been mounted on the container body 13 as a separate member in the aforementioned preferred embodiments, the container body may be directly provided with supporting ribs so that the container body is integrally formed with the wafer carrier. In this case, it is possible to have the same function and advantageous effects as those in the aforementioned preferred embodiments.

In addition, the carrier box may be provided with both of the internal-pressure adjusting mechanism 25 in the first preferred embodiment and the gasket 36 in the second preferred embodiment.

As mentioned above, according to the present invention, a thin-plate supporting container has the following advantageous effects.

Since the filter of the internal-pressure adjusting mechanism is designed to have the capacity to remove dust or the like without having high resistance when gas passes therethrough, it is possible to quickly respond to the abrupt change of air pressure outside the container. As a result, it is possible to optimally adjust the internal pressure in the thin-plate supporting container.

Since the filter can be easily removed from the container body, it is possible to easily carry out the processing such as reuse and recycling.

Since the gasket has the functions of allowing the passage of gas between the inside and outside of the container so as to maintain the internal pressure at the same value as that of the outside air pressure and of restricting the passage of dust or the like, it is possible to quickly respond to the abrupt change in the air pressure outside the thin-plate supporting container. As a result, the internal pressure in the thin-plate supporting container can quickly follow the change in the outside air pressure, and it is possible to optimally adjust the internal pressure while maintaining the interior of the container in the clean state.

Since the gasket is a separate member from the container body and the lid so as to be able to be easily removed from the container body and so forth, it is possible to easily carry out the processing such as reuse and recycling.

While the present invention has been disclosed in terms of the preferred embodiments in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A thin-plate supporting container comprising:
   a container body defining therein a chamber for supporting and housing therein a plurality of thin plates, said container body having a first groove;
   a lid for covering said container body, said lid having a second groove; and
   a gasket, removably fitted into said first groove and said second groove, for removing foreign matters from a gas while allowing the gas to easily enter and exit said chamber through said gasket so as to maintain said chamber in a clean state while maintaining the internal pressure inside said chamber at the same level as the external pressure outside said chamber, and said gasket is formed of a unitary porous material.

2. A thin-plate supporting container as set forth in claim 1, wherein said porous material has a plurality of fine pores, each having a smaller diameter than 1.0 μm.

3. A thin-plate supporting container as set forth in claim 1, wherein said porous material has a plurality of fine pores, each having a diameter in the range of from 0.5 to 1.0 μm.

4. A thin-plate supporting container as set forth in claim 1, wherein said gasket comprises a foamed fluorocarbon resin.

5. A thin-plate supporting container as set forth in claim 1, wherein said gasket comprises a foamed olefin resin.

6. A thin-plate supporting container as set forth in claim 1, wherein said gasket is formed of a woven fabric.

7. A thin-plate supporting container as set forth in claim 1, wherein said gasket is formed of a non-woven fabric.

8. A thin-plate supporting container as set forth in claim 1, further comprising a wafer carrier which is removably housed in the chamber of said container body and can support the plurality of thin plates.

9. A thin-plate supporting container as set forth in claim 1, wherein the container body comprises a side wall and an open upper side, and said lid covers the open upper side.

10. A thin-plate supporting container as set forth in claim 1, wherein the container body comprises an open side wall and an upper side, and said lid covers the open side wall.

11. A thin-plate supporting container as set forth in claim 1, wherein said lid removably covers said container body.

12. A thin-plate supporting container as set forth in claim 1, wherein said gasket is reusable after being detached from the container.

13. A thin-plate supporting container comprising:
   a container body defining therein a chamber, the container body having a first groove;
   a thin-plate carrier removably housed in the chamber of the container body for supporting a plurality of thin plates;
   a lid covering the container body, the lid having a second groove; and
   a porous gasket, removably fitted into the first groove and the second groove, the porous gasket removing foreign matters from a gas while allowing the gas to easily enter and exit the chamber through the porous gasket so as to maintain the chamber in a clean state while maintaining the internal pressure inside the chamber equal to the external pressure outside the chamber, and the porous gasket is formed of a unitary porous material.

14. The thin-plate supporting container of claim 13, wherein the porous gasket is composed of a material having a plurality of pores establishing communication between an inner surface and an outer surface of the porous gasket.

15. The thin-plate supporting container of claim 14, wherein the pores have a diameter of from about 0.5 to 1 μm.

* * * * *